US 7,837,805 B2

(12) United States Patent
Sandhu et al.

(10) Patent No.: US 7,837,805 B2
(45) Date of Patent: Nov. 23, 2010

(54) METHODS FOR TREATING SURFACES

(75) Inventors: Gurtej S. Sandhu, Boise, ID (US);
Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 211 days.

(21) Appl. No.: 11/847,073

(22) Filed: Aug. 29, 2007

(65) Prior Publication Data

US 2009/0056746 A1 Mar. 5, 2009

(51) Int. Cl.
*B08B 3/04* (2006.01)
*B08B 3/08* (2006.01)
*B08B 3/10* (2006.01)

(52) U.S. Cl. .................. 134/34; 134/3; 134/31; 134/35

(58) Field of Classification Search ............ 134/3, 134/36, 37
See application file for complete search history.

(56) References Cited

U.S. PATENT DOCUMENTS

| 5,035,750 | A | * | 7/1991 | Tada et al. ............ 438/472 |
| 5,326,035 | A | | 7/1994 | Ohmi et al. |
| 5,796,111 | A | * | 8/1998 | Mahoney ............ 250/492.2 |
| 5,850,841 | A | | 12/1998 | Han et al. |
| 6,033,484 | A | | 3/2000 | Mahoney |
| 6,066,032 | A | | 5/2000 | Borden et al. |
| 6,203,406 | B1 | * | 3/2001 | Rose et al. ............ 451/39 |
| 6,289,550 | B1 | | 9/2001 | Chen et al. |
| 2002/0023841 | A1 | | 2/2002 | Ahn et al. |
| 2002/0182113 | A1 | | 12/2002 | Shvets et al. |
| 2003/0029566 | A1 | | 2/2003 | Roth |
| 2003/0171239 | A1 | * | 9/2003 | Patel et al. ............ 510/406 |
| 2004/0007559 | A1 | | 1/2004 | Hongo et al. |
| 2004/0045578 | A1 | | 3/2004 | Jackson |
| 2004/0137750 | A1 | | 7/2004 | Nemoto et al. |

(Continued)

FOREIGN PATENT DOCUMENTS

JP 4075340 3/1992

(Continued)

OTHER PUBLICATIONS

Jerry J. Broz, Ph.D., et al. "Reducing Device Yield Fallout at Wafer Level Test With Electrohydrodynamic (EHD) Cleaning" ITC International Test Conference © 2000 IEEE pp. 477-484.

(Continued)

*Primary Examiner*—Michael Kornakov
*Assistant Examiner*—Natasha Campbell
(74) *Attorney, Agent, or Firm*—Wells St. John P.S.

(57) ABSTRACT

Some embodiments include methods of treating surfaces with aerosol particles. The aerosol particles may be formed as liquid particles, and then passed through a chamber under conditions which change the elasticity of the particles prior to impacting a surface with the particles. The change in elasticity may be an increase in the elasticity, or a decrease in the elasticity. The change in elasticity may be accomplished by causing a phase change of one or more components of the aerosol particles such as, for example, by at least partially freezing the aerosol particles, or by forming entrained bubbles within the aerosol particles. Some embodiments include apparatuses that may be utilized during treatment of surfaces with aerosol particles.

21 Claims, 4 Drawing Sheets

U.S. PATENT DOCUMENTS

| | | |
|---|---|---|
| 2004/0173580 A1 | 9/2004 | Carr |
| 2004/0194799 A1 | 10/2004 | Kim et al. |
| 2005/0189071 A1* | 9/2005 | Moriya et al. .......... 156/345.27 |
| 2006/0118132 A1* | 6/2006 | Bergman et al. ................ 134/1 |
| 2006/0169441 A1 | 8/2006 | Schlitz |
| 2006/0183654 A1 | 8/2006 | Small |
| 2007/0004316 A1 | 1/2007 | Ashjaee et al. |
| 2007/0077547 A1 | 4/2007 | Shvets et al. |
| 2007/0126799 A1 | 6/2007 | Steiner |

FOREIGN PATENT DOCUMENTS

| | | |
|---|---|---|
| JP | 2003054929 | 2/2003 |
| TW | 575921 | 2/2004 |
| TW | 239558 | 9/2005 |

OTHER PUBLICATIONS

J. Reece Roth "Prospective Industrial Applications of the One Atmosphere Uniform Glow Discharge Plasma" IAS 2004, © 2004 IEEE, pp. 216-223.

* cited by examiner

METHODS FOR TREATING SURFACES

TECHNICAL FIELD

Methods for treating surfaces (such as, for example, semiconductor substrate surfaces), and apparatuses for treating surfaces.

BACKGROUND

It is frequently desired to remove materials from over substrate surfaces. For instance, semiconductor fabrication may involve removal of contaminant particulates from over a semiconductor substrate surface, and/or stripping of sacrificial materials from over a semiconductor substrate surface. The terms "semiconductive substrate," "semiconductor construction" and "semiconductor substrate" mean any construction comprising semiconductive material (for instance, silicon and/or germanium), including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Numerous cleaning solutions and chemistries have been developed for removing materials from over semiconductor substrate surfaces. The cleaning solutions may, for example, comprise deionized water. The water may be utilized alone, or in combination with one or more of sulfuric acid, hydrochloric acid, hydrofluoric acid, ammonium hydroxide, hydrogen peroxide, etc. Accordingly, cleaning solutions may be acidic, basic, or of neutral pH, depending on the application.

Some materials are fairly easy to clean from over semiconductor substrates, in that the materials are chemically much different than the underlying surface of the semiconductor substrate. However, other materials can be difficult to remove selectively relative to an underlying surface of a semiconductor substrate in that the materials may be of the same composition, or of a similar composition, as one or more regions of the surface of the semiconductor substrate. Materials that can be particularly difficult to remove in some applications are silicon, silicon dioxide, silicon nitride, and polymeric organic materials.

A method being developed for removal of materials (for instance, particulates of varying size and shape) is to utilize liquid aerosol particles (which may also be referred to as clusters) to impact a surface of a semiconductor substrate and dislodge undesired materials from such surface. The liquid aerosol particles may dislodge the materials by physical interaction (analogous to bead-blasting), chemical interaction (in other words, reaction with the materials to convert them to a form more readily dislodged than an initial form), or a combination of physical interactions and chemical interactions. In some applications, the liquid aerosol particles may be charged so they have a polarity (either positive or negative), and the liquid aerosol particles may impart such polarity to the undesired materials on the substrate surface. The substrate may be charged to the same polarity as that imparted to the undesired materials so that electrostatic repulsion occurs between the substrate surface and the undesired materials to assist in dislodging such materials from the surface.

The liquid aerosol particles may be formed by passing liquid to an aerosol generator. The aerosol generator may be an aerosolizing (or atomizing) nozzle or spray head, such as, for example, an electrostatic nozzle, a piezoelectric nozzle, an ultrasonic or megasonic nozzle, or an electrohydrodynamic atomization nozzle. The term "aerosol" means a suspension or dispersion of fine particles (which may be referred to as clusters or droplets in some embodiments). The term "liquid aerosol particle" means aerosol particles that are primarily of a liquid phase, and is synonymous with the term "aerosol droplet". The liquid aerosol particles may have a volume of less than three picoliters; and may have a mean size distribution of less than 10 microns, and in some applications may have a mean size distribution of less than 100 nanometers.

The liquid aerosol particles may be directed toward a substrate surface via any suitable method, including, for example, spraying (fluid force propulsion), gas jet, electrical repulsive forces, etc.

Although aerosols have potential for utilization in cleaning various substrates, such as semiconductor substrates, they currently have limited application. It is desired to develop improved methods for cleaning substrates, such as semiconductor substrates, which improve applicability for utilization of aerosols in diverse applications.

DETAILED DESCRIPTION OF THE ILLUSTRATED EMBODIMENTS

Some embodiments include methods in which aerosol particles are utilized for treating surfaces, such as, -for example, semiconductor substrate surfaces. The aerosol particles may be subjected to conditions which change the elasticity of the particles prior to impacting a surface with the particles. The elasticity may be increased or decreased, depending on the application. A method for decreasing the elasticity is to freeze the aerosol particles, and a method for increasing the elasticity is to create gas bubbles entrained within the liquid aerosol particles.

Example embodiments are described below with reference to FIGS. 1-4.

Figure 1:
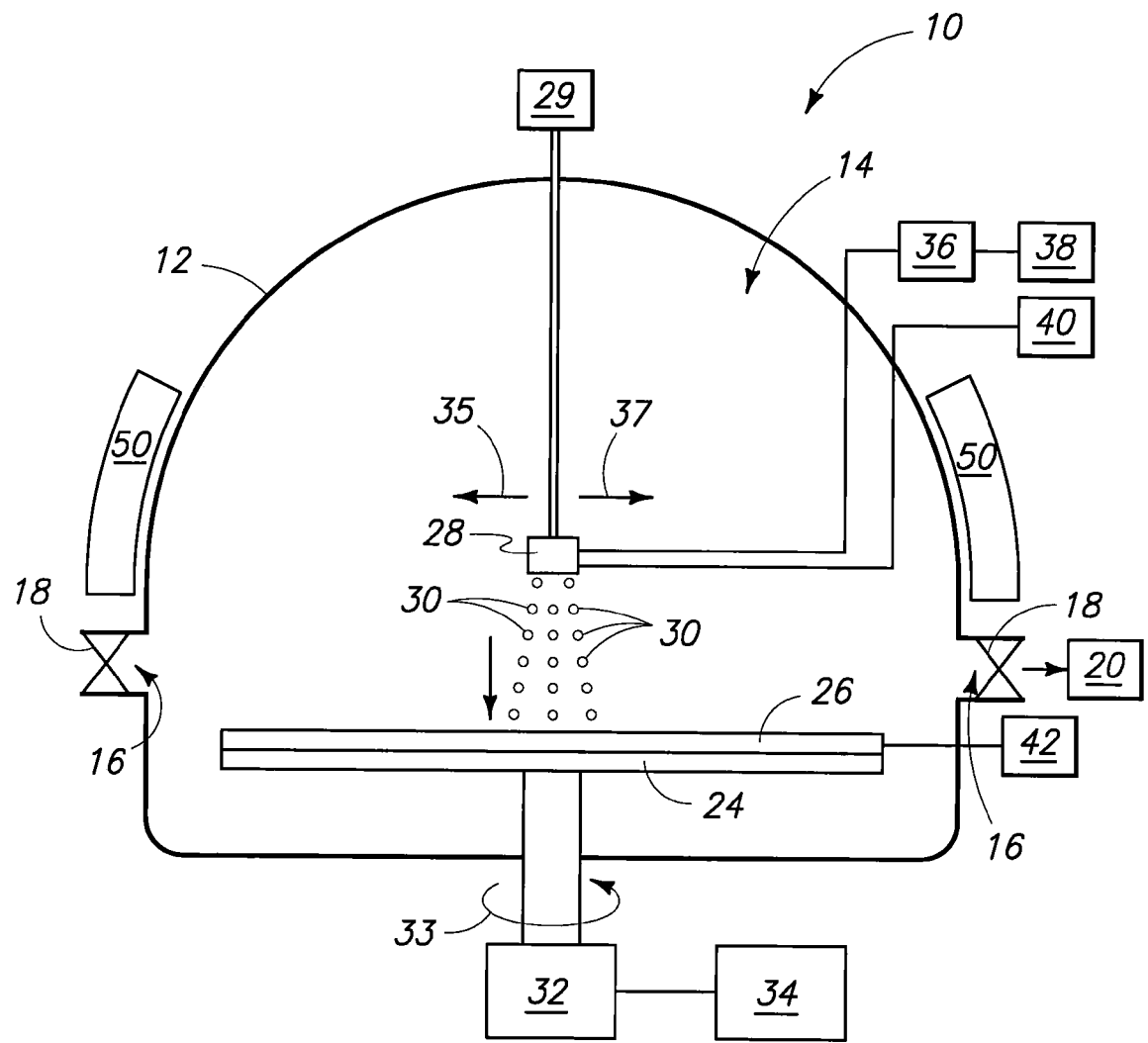
FIG. 1 is a diagrammatic view of an apparatus utilized for treating a substrate surface in accordance with example embodiments.

Referring initially to FIG. 1, an example apparatus 10 is illustrated being utilized in an example embodiment process for treating a surface with aerosol particles. The apparatus includes a sidewall 12 that extends around a reaction chamber 14.

Ports 16 extend through the sidewall to the chamber, and valves 18 regulate flow of materials through the ports. The ports are utilized for inlets and outlets to the chamber. In operation, the valves may be utilized to control flow into and out of the chamber so that desired pressures of materials may be provided within the chamber. One or more of the ports may be in fluid communication with a pump 20, which may be utilized during control of the pressure within the chamber.

A substrate holder 24 is within the chamber, and such retains a substrate 26. The substrate holder may be configured to retain specific types of substrates. In some embodiments, the substrate 26 may correspond to a semiconductor substrate, and the substrate holder may be configured to retain the semiconductor substrate (for instance, the substrate holder may have a recess with a size and shape complementary to the semiconductor substrate).

An aerosol-forming nozzle 28 is within the chamber, and in fluid connection with a reservoir 29. In operation, liquid is passed from reservoir 29 and through nozzle 28, whereupon it is atomized. The atomized liquid is then dispersed into the chamber as liquid aerosol particles (diagrammatically illustrated as aerosol particles 30, only some of which are labeled). The aerosol-forming nozzle may be comprised by any suitable aerosol generator, and may, for example, correspond to an electrostatic nozzle, a piezoelectric nozzle, an ultrasonic or megasonic nozzle, or an electrohydrodynamic atomization nozzle.

Although nozzle 28 is shown within chamber 14, in other embodiments the nozzle may be external of the chamber so that aerosol is formed outside of the chamber, and then passed through an opening in the chamber sidewall to enter the chamber. In any event, nozzle 28 will be proximate the chamber so that aerosol formed by the nozzle may be directed toward the upper surface of the substrate 26 retained within the chamber.

The aerosol particles 30 are directed toward an upper surface of substrate 26. Such may be accomplished by fluid-force propulsion through nozzle 28. The propulsion of the aerosol particles toward the substrate surface may alternatively, or additionally, include blending a gas jet with the fluid stream entering nozzle 28, and utilizing the gas stream to push the aerosol particles toward the substrate. In some embodiments, the propulsion of the aerosol particles toward the substrate surface may alternatively, or additionally, include providing electrical charge to the aerosol particles and to one or more components within the chamber so that the aerosol particles may be electrostatically attracted and/or repelled from various components to direct the aerosol particles toward the substrate. For instance, focusing rings and/or electrodes of the types described in U.S. patent publication number 2006/0118132 may be utilized to direct the aerosol particles.

In the shown embodiment, nozzle 28 is coupled with a power source 40, and substrate 26 is coupled with a power source 42. The nozzle 28 may be an electrohydrodynamic nozzle powered by source 40. Further, the power source 40 may be utilized to induce a polarity to the aerosol particles 30.

Power source 42 may induce a polarity onto substrate 26. In some embodiments, the polarity induced on substrate 26 may be opposite to that induced on aerosol particles 30 (for instance, the polarity on the aerosol particles may be negative and that induced on the upper surface of substrate may be positive). The opposite polarities cause the aerosol particles 30 to be attracted to the upper surface of the substrate by electrostatic forces. In other embodiments, the polarity induced on substrate 26 may be the same as that induced on the aerosol particles so that electrostatic repulsive forces between the particles and the substrate help to remove contaminants from the substrate upon interaction of the contaminants with the aerosol particles.

The aerosol particles 30 are shown impacting a small region of the upper surface of substrate 26. In some embodiments, it may be desired to treat only specific small regions of the upper surface of the substrate. In other embodiments, it may be desired to uniformly treat an entirety of the upper surface of the substrate. If it is desired to treat the entirety of the upper surface of the substrate, multiple nozzles may be used to create aerosol coverage across the entire surface. Alternatively, or additionally, one or both of the substrate and the aerosol-generating nozzle may be moved during treatment of the substrate. For instance, substrate holder 24 is shown connected to a motor 32 which in turn is connected with a power source 34. The motor may be configured to rotate the substrate holder (as illustrated by arrow 33) when powered by the source 34. The rotation of the substrate holder rotates substrate 26. Rotation of substrate 26 may enable more uniform treatment of an upper source of the substrate than would be achieved without rotation. Also, nozzle 28 is shown coupled to a motor 36, which in turn is coupled to a power source/control unit 38. The motor 36 may be utilized for moving the nozzle 28 laterally within the chamber (as illustrated by arrows 35 and 37) which, in combination with rotation of substrate 26, may enable the nozzle to be utilized for treatment of the entire surface of substrate 26.

Although all of the aerosol is shown directed toward the substrate, in practice the aerosol may disperse or evaporate within the chamber so that some of the aerosol particles do not reach the substrate surface.

The aerosol may comprise any droplets suitable for the intended removal of particular materials from over the surface of substrate 26. For instance, if the substrate corresponds to a semiconductor substrate, the aerosol droplets 30 may comprise traditional cleaning liquids utilized for cleaning a semiconductor substrate surface; and may, for example, comprise, consist essentially of, or consist of deionized water, either alone, or in combination with one or more of sulfuric acid, hydrochloric acid, hydrofluoric acid, ammonium hydroxide, hydrogen peroxide, etc. Accordingly, the aerosol droplets may be of basic pH, neutral pH, or acidic pH in various embodiments.

Apparatus 10 comprises a temperature control system 50 provided proximate the chamber. The temperature control system may comprise, for example, one or both of a condenser and a heater, and may be utilized for changing or maintaining temperature within the chamber. The temperature control system 50 may be entirely external to the chamber, as shown, or may have portions (not shown) extending within the chamber.

The temperature control system 50 and pump 20 may each be considered to be a condition changing system provided proximate the chamber. Specifically, the temperature control system and/or pump may be utilized to change one or both of temperature and pressure within the chamber. The change in temperature and/or pressure can change physical properties of the aerosol particles 30, which in turn can alter elasticity of the aerosol particles. The change in physical properties may be a phase change of one or more components of the aerosol particles. For instance, an increase in temperature, and/or a decrease in pressure, may cause solubilized gas to come out of solution and thus form gas bubbles within the liquid aerosol particles. As another example, a decrease in temperature and/or an increase in pressure may cause freezing of one or more components of the aerosol particles.

Figure 2:
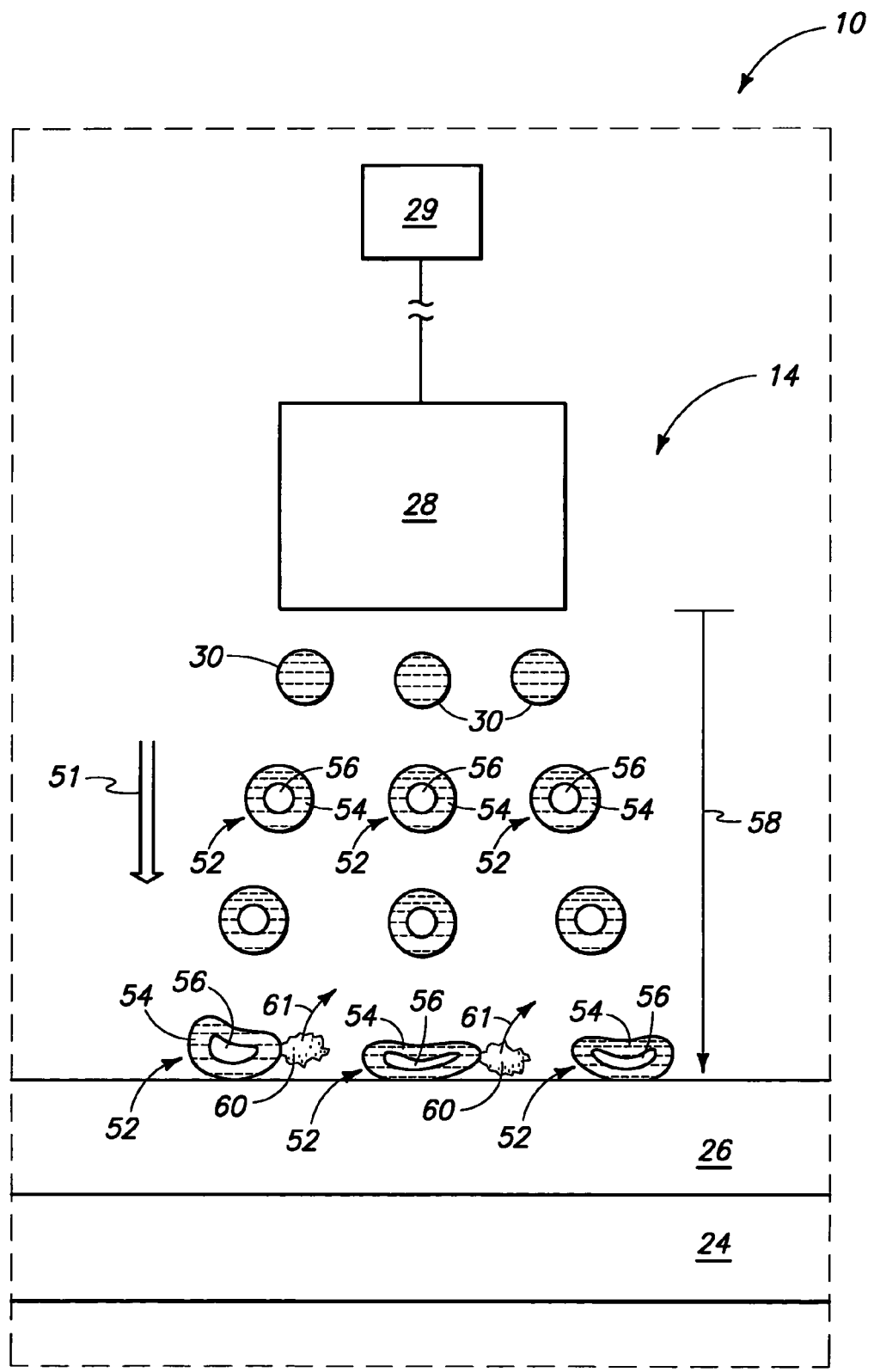
FIG. 2 shows a diagrammatic view of a portion of the apparatus of FIG. 1 at a processing stage for treating a substrate surface in accordance with an embodiment.
Figure 3:
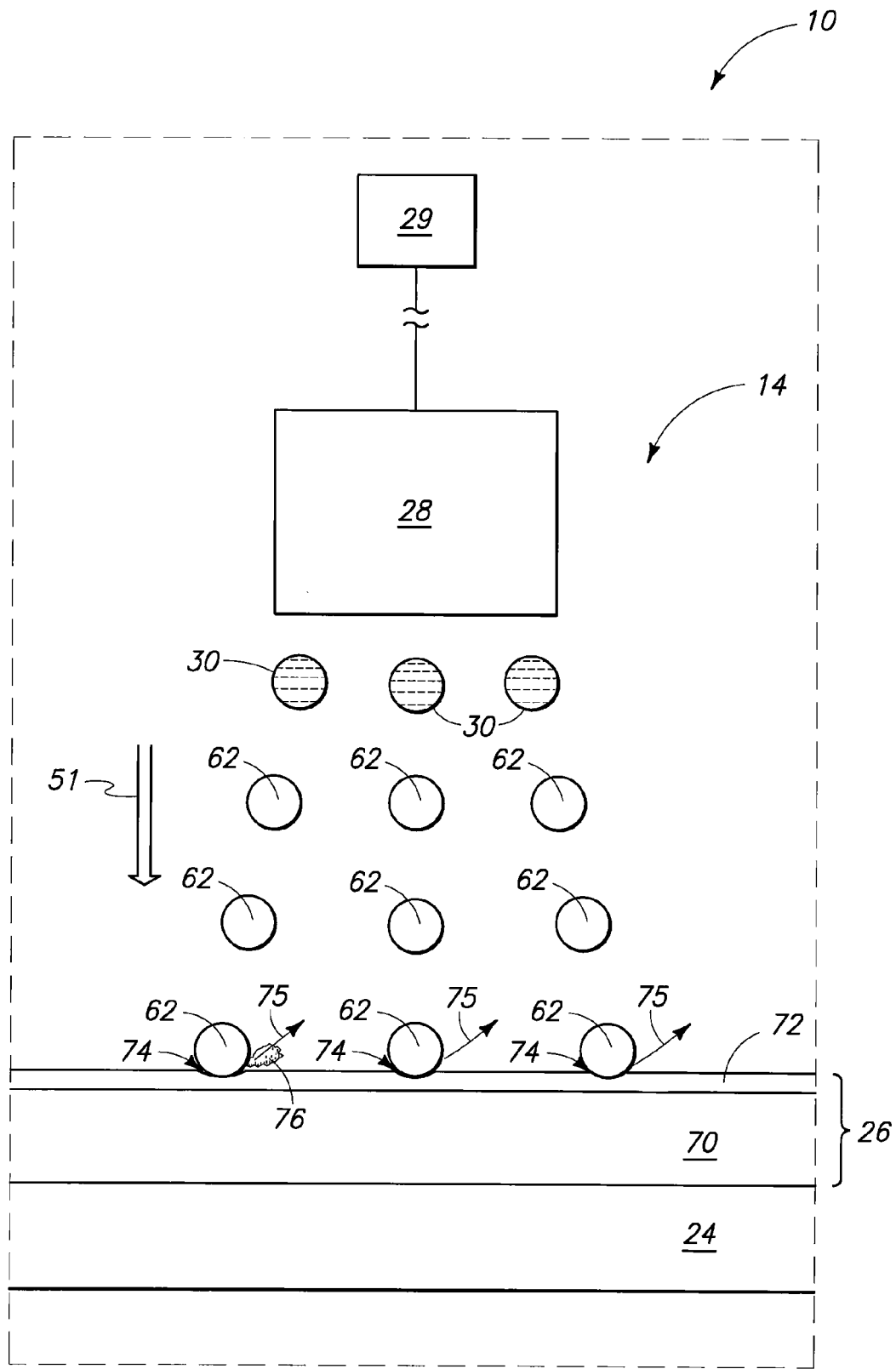
FIG. 3 shows a diagrammatic view of a portion of the apparatus of FIG. 1 at a processing stage for treating a substrate surface in accordance with an embodiment.
Figure 4:
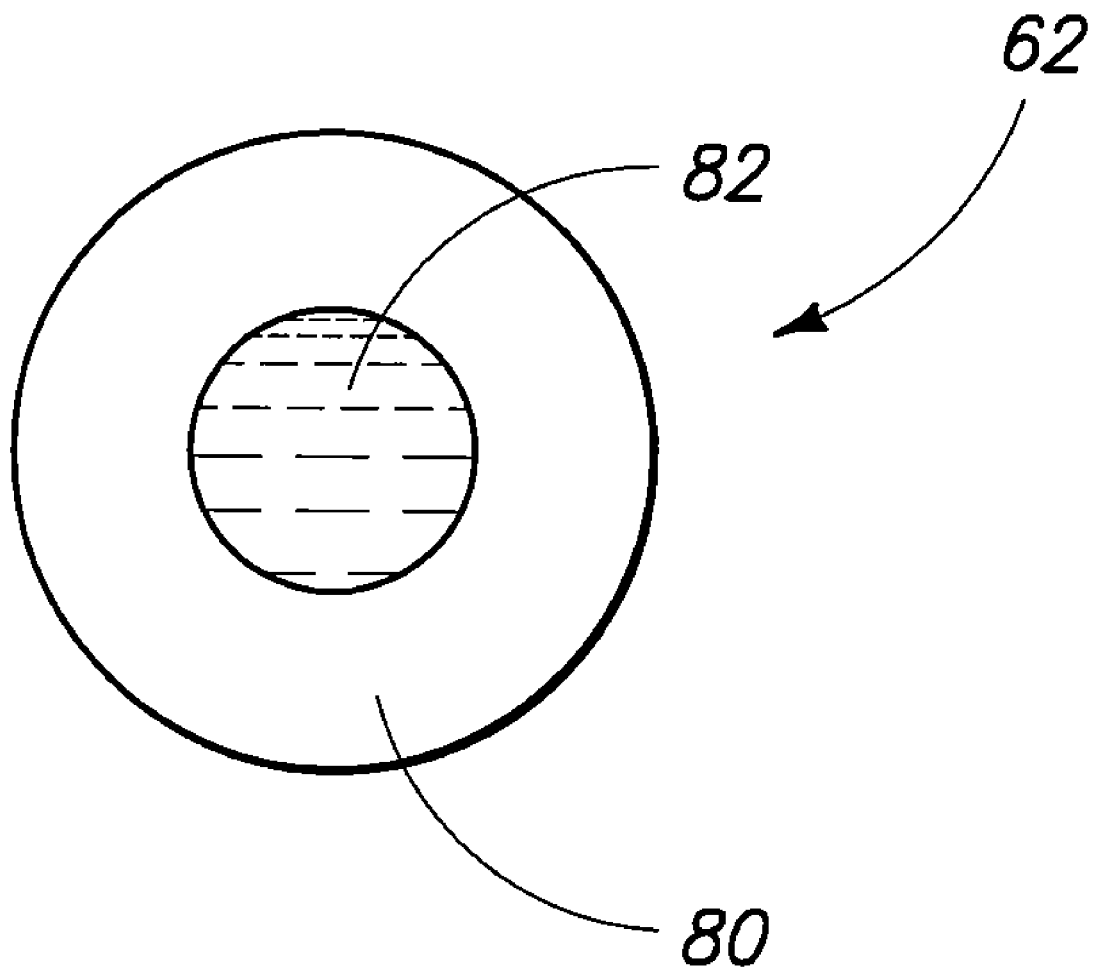
FIG. 4 shows a diagrammatic view of an aerosol particle in accordance with an embodiment.

FIGS. 2-4 show example embodiments in which a phase change within the aerosol particles causes a change in elasticity of the particles prior to the impacting of the particles with the surface of substrate 26.

Referring to FIG. 2, a portion of apparatus 10 is illustrated. The portion is a region within chamber 14. The sidewall 12 (FIG. 1), pump 20 (FIG. 1), temperature control systems 50 (FIG. 1) and numerous other components of the apparatus of FIG. 1 are not illustrated in FIG. 2 in order to simplify the drawing.

FIG. 2 shows a nozzle 28 forming liquid aerosol particles 30. The aerosol particles are directed toward an upper surface of substrate 26 along a direction indicated by arrow 51. The aerosol particles change as they progress from nozzle 28 toward the upper surface of substrate 26. Specifically, the aerosol particles change from being solely liquid phase particles 30 to being liquid phase/gas phase particles 52 (only some of which are labeled). The liquid phase/gas phase particles have gas bubbles 56 entrained within a liquid covering 54 (the covering may also be referred to as a case or encapsulant).

The conversion from liquid phase particles 30 to liquid phase/gas phase particles 52 may be accomplished by forming the particles 30 to comprise gas solubilized in liquid, and then subjecting the particles to appropriate temperature and pressure conditions to reduce the solubility of the gas and thereby cause at least some of the gas to come out of solution. The gas that comes out of solution may bubble from the particles and be released. However, if the remaining liquid of the particles has appropriate surface tension, at least some of the gas may be retained as a bubble encapsulated by the liquid (as shown in the liquid phase/gas phase particles 52). Although one bubble is shown within each of the liquid phase/gas phase particles, in other embodiments multiple bubbles may be formed within each liquid phase/gas phase particle. The amount of total volume of a liquid phase/gas phase particle consumed by the one or more gas bubbles entrained therein may be greater than or equal to about 25%.

A specific embodiment is as follows. The liquid provided within reservoir 29 comprises a solution containing gas solubilized in liquid. The gas may be provided to high concentration within the liquid, and may be provided to saturation, or near saturation within the liquid. The liquid component of the solution may be non-reactive relative to exposed materials along the upper surface of substrate 26, or, in other embodiments, may be chemically reactive relative to at least some of the materials along the upper surface of substrate 26 that are desired to be removed. In some embodiments, the liquid component may comprise a cleaning solution having a composition known in the art to be suitable for removing particular types of contaminants from over semiconductor substrates. The liquid component may, for example, comprise, consist essentially of, or consist of water, either alone, or having one or more of hydrochloric acid, hydrofluoric acid, sulfuric acid, ammonium hydroxide, tetramethyl ammonium hydroxide, and tetraethyl ammonium hydroxide dissolved therein. The gas component of the solution may consist of gas that is non-reactive (in other words, chemically inert) relative to exposed materials along the upper surface of substrate 26, and may, for example, consist of one or more of nitrogen, argon, neon, helium, krypton and xenon. Alternatively, the gas may comprise one or more compositions that react with one or more materials along the semiconductor substrate surface. Such compositions may, for example, be selected from the group consisting of $H_2$, $NF_3$, $O_2$ and ozone. The $H_2$ may reduce exposed materials (like metals) along the surface of substrate 26, and the $O_2$ and/or ozone may oxidize exposed materials (like metals or silicon) along the upper surface of substrate 26.

A temperature gradient 58 may be provided within the chamber 14 so that the temperature of the aerosol particles increases as the particles travel from nozzle 28 to substrate 26. Such can reduce the solubility of the gas component to cause such component to form bubbles within the aerosol particles (as shown in the particles 52).

An alternative method for providing a change in conditions which reduces solubility of gas within the aerosol particles is to form the aerosol particles from a solution at a first temperature, and to have the interior of the chamber at a second, higher, temperature so that the particles are immediately exposed to the higher temperature upon formation of such particles. In such embodiments, the temperature may be constant throughout the chamber, rather than a gradient. Also, the particles may immediately form to have the gas bubbles therein; in contrast to the illustrated example in which the particles initially form as the liquid phase particles 30, and subsequently transition from the liquid state particles to the liquid phase/gas phase particles.

Another method for providing a change in conditions which reduces solubility of gas within the aerosol particles is to utilize a pressure change to reduce the solubility of the gas. In such embodiments, the chamber 14 may be maintained at a pressure at which at least some of the gas comes out of solution.

Although the gas phase/liquid phase aerosol particles are described above as being formed from a solution having gas solubilized in liquid, another method is to form the particles from a solution (or mixture) having at least two different liquids mixed with one another. If one of the liquids has a lower volatilization point than the other, the conditions within the chamber may be chosen to volatilize one of the liquids while leaving another in the liquid state to thereby form the gas phase/liquid phase aerosol particles. For instance any of various organic solvents (such as, for example, isopropyl alcohol, methanol, N-methylpyrrolidone, and 2-[2-aminoethoxy]ethanol) may be dispersed within water, and then volatilized to form gas under appropriate conditions.

The gas phase/liquid phase aerosol particles have higher elasticity than particles consisting of liquid, and thus may absorb more force upon impacting surface 26 than do particles consisting of liquid. Accordingly, the gas phase/liquid phase aerosol particles 52 are shown undergoing high compression upon impacting the upper surface of substrate 26. Such high compression and corresponding absorption of force by the gas phase/liquid phase aerosol particles can reduce the impact force of the particles on the substrate surface relative to aerosol particles consisting of liquid. Such can reduce damage to the surface relative to that which may occur utilizing aerosol particles consisting of liquid.

The gas phase/liquid phase aerosol particles may impact the surface of substrate 26 with sufficient force to dislodge contaminating particulates from such surface, as is diagrammatically illustrated by the dislodging of contaminating particulates 60 (arrows 61 are provided to illustrate dislodgment of the contaminating particulates). In some embodiments, the gas phase/liquid phase aerosol particles may chemically react with the contaminating particulates to at least partially dissolve the contaminating particulates. In some embodiments, the gas phase/liquid phase aerosol particles may carry a charge (with the charge having a polarity of either positive or negative) and transfer such charge to the contaminating particulates upon physical interaction of the aerosol particles with the contaminating particulates. The substrate may then be charged to the same polarity as the gas phase/liquid phase aerosol particles to assist in dislodgment of the contaminating particulates through electrostatic repulsion.

FIG. 3 shows another embodiment for utilizing aerosol particles having a different elasticity than particles consisting of liquid, and specifically shows an embodiment for utilizing aerosol particles having a lower elasticity than particles consisting of liquid. FIG. 3 shows the portion of apparatus 10 previously utilized in FIG. 2, but shows substrate 26 comprising a lower portion 70 and an upper portion 72. The lower portion may comprise a semiconductor wafer having one or more levels of integrated circuitry (not shown) associated therewith, and the upper portion may comprise a sacrificial material that is to be stripped from over the lower portion. The upper portion may, for example, comprise one or more of photoresist, silicon dioxide, silicon nitride, etc.

FIG. 3 shows the nozzle 28 forming liquid aerosol particles 30. The aerosol particles are directed toward an upper surface of substrate 26 along the direction indicated by arrow 51. The aerosol particles change as they progress from nozzle 28 toward an upper surface of substrate 26. Specifically, the aerosol particles change from being liquid phase particles 30 to being solid phase particles 62.

The aerosol particles may be frozen by providing temperature/pressure conditions within chamber 14 that cause the particles to change phase from the liquid phase to the solid phase. Such conditions may comprise low temperature and/or high-pressure, and can be chosen to be suitable for particular compositions of the aerosol particles. For instance, if the particles comprise, consist essentially of, or consist of water, the conditions within the chamber may comprise approximately atmospheric pressure and a temperature below 0° C. The water may be frozen at a different temperature if pressures other than atmospheric pressure are chosen, and/or if solvents or other materials are dissolved in the water. The aerosol particles may expand upon being frozen (for instance, if water is being frozen) or may shrink upon being frozen. In some embodiments, the freezing may be induced by increasing evaporative cooling of the aerosol particles.

The freezing of the aerosol particles hardens the particles (in other words, reduces the elasticity of the particles), which may improve the particles for utilization in applications in which the particles are to be utilized as microscopic beads for bead-blasting of the upper surface of substrate 26. For instance, in the shown application the hard particles 62 impact upper surface 72 to form craters 74, and eject some of the material 72 (as indicated by the arrows 75). Such may strip material 72 from substrate 26, particularly if material 72 is softer than frozen particles 62.

The frozen particles 62 may also dislodge contaminating particulates (such as the shown contaminating particulate 76), and cause such particulates to be ejected off from substrate 26.

The freezing of the aerosol particles may render a distribution of momentum across the particles to be more uniform than such distribution would be if the particles remained liquid. The momentum of the particles is proportional to the mass of the particles, and to the velocity of the particles. The velocity may be altered by deformation of the liquid particles occurring as the particles travel to the substrate surface and/or the mass may be affected by evaporation from the liquid particles as the particles travel to the substrate surface. The changes in mass and velocity of individual particles can lead to a wide distribution of momentum across a population of aerosol particles. Such wide distribution can render it difficult to uniformly treat differing regions of a semiconductor substrate. The problem with the wide distribution of momentum can become exacerbated with increasing distance of the atomization nozzle 28 from a substrate, and can become further exacerbated if the atomization nozzle is not maintained at a uniform distance from a substrate during treatment of the substrate. However, the freezing of the aerosol particles can alleviate the changes in mass and velocity of individual particles, and can thus tighten the momentum distribution across a population of the aerosol particles. This can improve uniformity of treatment across differing regions of a semiconductor substrate relative to conventional methods, can enable an atomization nozzle to be further from a substrate, and can increase the performance window associated with variability of the distance of an atomization nozzle from a substrate.

If the aerosol particles shrink upon being frozen, the momentum of the particles may increase. Regardless of whether the aerosol particles shrink or not upon being frozen, the impact force of the particles on the upper surface of substrate 26 may be increased relative to liquid traveling at the same velocity as the solid particles due to the decreased elasticity of the solid particles relative to the liquid particles. If the frozen particles have sufficient momentum, it may be possible to use them under higher pressures than are conventionally utilized for liquid aerosol particles. The liquid aerosol particles are typically utilized at low pressures to avoid collisions of the liquid aerosol particles with gas molecules. However, the solid aerosol particles may be suitable for utilization at higher pressures, and may even be suitable for utilization at atmospheric pressure or above.

The frozen particles 62 of FIG. 3 are shown to be entirely frozen. In some embodiments, the frozen particles will be only partially frozen. Such may occur, for example, in embodiments in which the particles are formed from a solution comprising two or more components which freeze under different conditions relative to one another (for instance, the two components may comprise water and an oil). In such embodiments, conditions may be chosen which freeze one of the components while leaving the other component liquid. The partially-frozen particles 62 may be slushy, may comprise a solid encapsulant around a liquid core, or may comprise a liquid encapsulant around a solid core. FIG. 4 illustrates an example embodiment in which a partially-frozen particle 62 comprises a solid encapsulant 80 around a liquid core 82.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim,

1. A method for treating a surface, comprising:
placing a semiconductor substrate within a chamber, the semiconductor substrate comprising the surface that is to be treated;
forming a mixture comprising liquid saturated with a gas;
passing the mixture through a nozzle and into the chamber to disperse the mixture into aerosol particles within the chamber; the nozzle being a distance from the semiconductor substrate, and the aerosol particles being transported across such distance to the semiconductor substrate surface;
providing a temperature gradient along the distance from the nozzle to the semiconductor substrate surface within the chamber, with said gradient comprising an increase in temperature along a direction from the nozzle to the semiconductor substrate surface;
the gas being released from the mixture while the aerosol particles are transported along the temperature gradient within the chamber, and the liquid within the aerosol particles having sufficient surface tension so that at least some of the released gas within individual aerosol particles is retained as one or more bubbles encapsulated by liquid of the individual aerosol particles; and
impacting the semiconductor substrate surface with the aerosol particles having the gas bubbles encapsulated therein.

2. The method of claim 1 wherein the liquid of the aerosol particles consists of one or more compositions that are chemically inert relative to reaction with the semiconductor substrate surface.

3. The method of claim 1 wherein the liquid of the aerosol particles comprises one or more compositions that are chemically reactive with one or more materials along the semiconductor substrate surface.

4. The method of claim 1 wherein the liquid of the aerosol particles comprises water having one or more of hydrochloric acid, hydrofluoric acid, sulfuric acid, ammonium hydroxide, tetramethyl ammonium hydroxide, and tetraethyl ammonium hydroxide dissolved therein.

5. The method of claim 1 wherein the gas bubbles of the aerosol particles consist of one or more compositions that are chemically inert relative to reaction with the semiconductor substrate surface.

6. The method of claim 5 wherein said one or more compositions comprise one or more of nitrogen, argon, neon, helium, krypton and xenon.

7. The method of claim 1 wherein the gas bubbles of the aerosol particles comprise one or more compositions that react with one or more materials along the semiconductor substrate surface.

8. The method of claim 7 wherein said one or more compositions comprise one or more of $H_2$, $NF_3$, $O_2$ and ozone.

9. The method of claim 7 wherein said one or more materials are comprised by contaminating particulates along the semiconductor substrate surface.

10. A method for treating a surface, comprising:
   placing a semiconductor substrate within a chamber, the semiconductor substrate comprising the surface that is to be treated;
   forming a mixture comprising two liquids which differ in volatility relative to one another; one of said two liquids being a higher volatility liquid and the other being a lower volatility liquid;
   passing the mixture through a nozzle and into the chamber to disperse the mixture into aerosol particles within the chamber; the liquid within the aerosol particles exhibiting a surface tension, the nozzle being a distance from the semiconductor substrate, and the aerosol particles being transported across such distance to the semiconductor substrate surface;
   providing a temperature gradient along the distance from the nozzle to the semiconductor substrate surface within the chamber, with said gradient comprising an increase in temperature along a direction from the nozzle to the semiconductor substrate surface;
   the distance, temperature gradient, and surface tension are sufficient so that the higher volatility liquid of the mixture volatilizes and thereby is converted to gas as the aerosol particles are transported along the temperature gradient within the chamber and so that at least some of the gas within individual aerosol particles is retained as one or more bubbles encapsulated by the lower volatility liquid of the individual aerosol particles before reaching the semiconductor substrate surface; and
   impacting the semiconductor substrate surface with the aerosol particles having the gas bubbles encapsulated therein.

11. The method of claim 10 wherein the higher volatility liquid comprises an organic composition; and wherein the lower volatility liquid comprises water.

12. The method of claim 10 wherein the higher volatility liquid is selected from the group consisting of isopropyl alcohol, methanol, N-methylpyrrolidone and 2-[2-aminoethoxy] ethanol; and
   wherein the lower volatility liquid includes water.

13. A method for treating a surface, comprising:
   placing a semiconductor substrate within a chamber, the semiconductor substrate comprising the surface that is to be treated;
   forming a mixture comprising liquid saturated with a gas;
   passing the mixture through a nozzle and into the chamber to disperse the mixture into aerosol particles within the chamber; the liquid within the aerosol particles exhibiting a surface tension, the nozzle being a distance from the semiconductor substrate, and the aerosol particles being transported across such distance to the semiconductor substrate surface;
   providing a temperature gradient along the distance from the nozzle to the semiconductor substrate surface within the chamber, with said gradient comprising an increase in temperature along a direction from the nozzle to the semiconductor substrate surface;
   the distance, temperature gradient, and surface tension are sufficient so that the gas is released from the mixture while the aerosol particles are transported along the temperature gradient within the chamber and so that at least some of the released gas within individual aerosol particles is retained as one or more bubbles encapsulated by liquid of the individual aerosol particles before reaching the semiconductor substrate surface; and
   impacting the semiconductor substrate surface with the aerosol particles having the gas bubbles encapsulated therein.

14. The method of claim 13 wherein the liquid of the aerosol particles consists of one or more compositions that are chemically inert relative to reaction with the semiconductor substrate surface.

15. The method of claim 13 wherein the liquid of the aerosol particles comprises one or more compositions that are chemically reactive with one or more materials along the semiconductor substrate surface.

16. The method of claim 13 wherein the liquid of the aerosol particles comprises water having one or more of hydrochloric acid, hydrofluoric acid, sulfuric acid, ammonium hydroxide, tetramethyl ammonium hydroxide, and tetraethyl ammonium hydroxide dissolved therein.

17. The method of claim 13 wherein the gas bubbles of the aerosol particles consist of one or more compositions that are chemically inert relative to reaction with the semiconductor substrate surface.

18. The method of claim 17 wherein said one or more compositions comprise one or more of nitrogen, argon, neon, helium, krypton and xenon.

19. The method of claim 13 wherein the gas bubbles of the aerosol particles comprise one or more compositions that react with one or more materials along the semiconductor substrate surface.

20. The method of claim 19 wherein said one or more compositions comprise one or more of $H_2$, $NF_3$, $O_2$ and ozone.

21. The method of claim 19 wherein said one or more materials are comprised by contaminating particulates along the semiconductor substrate surface.

* * * * *

UNITED STATES PATENT AND TRADEMARK OFFICE
CERTIFICATE OF CORRECTION

PATENT NO. : 7,837,805 B2
APPLICATION NO. : 11/847073
DATED : November 23, 2010
INVENTOR(S) : Gurtej S. Sandhu et al.

Page 1 of 1

It is certified that error appears in the above-identified patent and that said Letters Patent is hereby corrected as shown below:

In column 10, lines 1-5, in Claim 12, delete "12. The method of claim 10 wherein the higher volatility liquid is selected from the group consisting of isopropyl alcohol, methanol, N-methylpyrrolidone and 2-[2-aminoethoxy]ethanol; and
    wherein the lower volatility liquid includes water."

and insert -- 12. The method of claim 10 wherein the higher volatility liquid is selected from the group consisting of isopropyl alcohol, methanol, N-methylpyrrolidone and 2-[2-aminoethoxy]ethanol; and wherein the lower volatility liquid includes water. --, therefor.

Signed and Sealed this
Twenty-fifth Day of January, 2011

David J. Kappos
*Director of the United States Patent and Trademark Office*